United States Patent
Hoede et al.

(10) Patent No.: US 10,523,203 B2
(45) Date of Patent: Dec. 31, 2019

(54) ADAPTIVE POWER SAVING IN FIELD PROGRAMMABLE GATE ARRAY (FPGA) IN OPTICAL MODULE

(71) Applicants: OE SOLUTIONS CO., LTD., Gwangju (KR); AimValley B.V., Hilversum (NL)

(72) Inventors: Christiaan Hoede, Diemen (NL); Rob Farla, The Hague (NL)

(73) Assignees: OE SOLUTIONS CO., LTD., Gwangju (KR); AIMVALLEY B.V., Hilversum (NL)

( * ) Notice: Subject to any disclaimer, the term of this patent is extended or adjusted under 35 U.S.C. 154(b) by 235 days.

(21) Appl. No.: 15/381,278

(22) Filed: Dec. 16, 2016

(65) Prior Publication Data

US 2018/0175858 A1    Jun. 21, 2018

(51) Int. Cl.
| | | |
|---|---|---|
| *H03K 19/00* | (2006.01) | |
| *H03K 19/177* | (2006.01) | |
| *H04B 10/40* | (2013.01) | |
| *H03K 3/03* | (2006.01) | |
| *G06F 1/3296* | (2019.01) | |
| *G06F 1/26* | (2006.01) | |
| *G06F 1/08* | (2006.01) | |
| *G06F 1/324* | (2019.01) | |
| *G06F 1/3206* | (2019.01) | |

(52) U.S. Cl.
CPC ... *H03K 19/0016* (2013.01); *H03K 19/17784* (2013.01); *H04B 10/40* (2013.01); *G06F 1/08* (2013.01); *G06F 1/26* (2013.01); *G06F 1/324* (2013.01); *G06F 1/3206* (2013.01); *G06F 1/3296* (2013.01); *H03K 3/0315* (2013.01)

(58) Field of Classification Search
CPC .......... G06F 1/26; G06F 1/324; G06F 1/3296; G06F 1/3206; G06F 1/08; H03K 19/0016; H03K 19/17784; H03K 3/0315; H04B 10/40
USPC .................................................. 713/300, 322
See application file for complete search history.

(56) References Cited

U.S. PATENT DOCUMENTS

| | | | | |
|---|---|---|---|---|
| 6,512,617 B1* | 1/2003 | Tanji | ...................... | H04B 10/40 |
| | | | | 398/137 |
| 7,142,009 B1* | 11/2006 | Watt | ................... | H03K 19/0008 |
| | | | | 326/38 |
| 8,182,141 B1* | 5/2012 | Collins | .................. | G01K 11/22 |
| | | | | 374/119 |
| 9,915,696 B1* | 3/2018 | Savithri | ......... | G01R 31/318516 |

(Continued)

*Primary Examiner* — Ji H Bae
(74) *Attorney, Agent, or Firm* — Ichthus International Law PLLC (57) ABSTRACT

An apparatus for saving power in an field programmable gate array (FPGA) in an optical communication device is provided. The apparatus includes at least one ring oscillator having an operating frequency disposed inside the FPGA, a core voltage switching unit configured to supply a core operating voltage to the FPGA, and control logic configured to adaptively output an adjusted new core voltage to the FPGA via the core voltage switching unit. The control logic is configured to output a core voltage control signal to the core voltage switching unit based on the operating frequency of the at least one ring oscillator. The core voltage switching unit is further configured to supply the adjusted new core voltage to the FPGA in accordance with the core voltage control signal.

9 Claims, 7 Drawing Sheets

(56) References Cited

U.S. PATENT DOCUMENTS

| | | | | |
|---|---|---|---|---|
| 2006/0071722 A1* | 4/2006 | Paillet | ............... | H03K 3/0322 |
| | | | | 331/57 |
| 2008/0104434 A1* | 5/2008 | May | ............... | G06F 1/3203 |
| | | | | 713/322 |
| 2010/0042960 A1* | 2/2010 | Fazekas | ............... | G06F 17/5036 |
| | | | | 716/106 |
| 2012/0013408 A1* | 1/2012 | Cortadella | ............... | G06F 17/505 |
| | | | | 331/34 |
| 2012/0074998 A1* | 3/2012 | Brett | ............... | H03L 1/022 |
| | | | | 327/157 |
| 2014/0359311 A1* | 12/2014 | Jahagirdar | ............... | G06F 1/26 |
| | | | | 713/300 |
| 2017/0033870 A1* | 2/2017 | Dangui | ............... | H04J 14/0279 |
| 2017/0315887 A1* | 11/2017 | Olson | ............... | G06F 11/2033 |

* cited by examiner

ADAPTIVE POWER SAVING IN FIELD PROGRAMMABLE GATE ARRAY (FPGA) IN OPTICAL MODULE

TECHNICAL FIELD

The present disclosure relates to power saving methods and apparatuses in a field programmable gate array (FPGA), and in particular, to methods and systems for saving power in the FPGA used in an optical module.

BACKGROUND

Nowadays, high speed data communications are often accomplished through optical communications, in which optical transceivers communicate with each other over optical fiber channels over a distance. The optical transceivers convert electrical data signals generated by users of a network into optical signals modulated at high data rates (or data transmission rates), and vice versa. An optical transceiver includes an opto-electric component or device that includes both an optical transmitter which is configured to receive electrical signals from a host device and convert them into optical signals for transmission over an optical network, and an optical receiver which is configured to receive optical signals and converts them into electrical signals for reception by the host device. The optical transmitter and receiver in an optical transceiver may share common circuitry and a same housing. The optical transmitter may include a Transmitter Optical Sub Assembly (TOSA) and the optical receiver may include a Receiver Optical Sub Assembly (ROSA). The TOSA include a laser or light emitting device that converts electrical signal into light or optical signal for transmission of the optical signal in a fiber optic network system. The ROSA include a photodiode device which converts light or optical signal into electrical signal.

In advances in technology, an optical module, such as a small form-factor pluggable (SFP), SFP+, or 10 Gigabit SFP (XFP) optical transceiver, may include one or more field programmable gate arrays (FPGAs) to add various "smart" functions to the SFP/SFP+/XFP module. By adding this "smart" functionality to the SFP/SFP+/XFP module, a level of power dissipation may increase with the use of FPGA components, which use fixed voltage settings according to device specifications. Further, because of high operating temperatures of the SFP/SFP+/XFP module, the FPGA components may dissipate even more power which is caused by internal leakage of transistors in the FPGA components.

As such, there is still a need for further improved and more efficient methods and systems for saving power in the FPGA components used in SFP/SFP+/XFP modules in optical communications.

SUMMARY

This summary is not intended to identify key features or essential characteristics of the claimed subject matter, nor is it intended to limit the scope of the claimed subject matter.

Considering the above described problems and unmet needs as well as others, various aspects of the present disclosure provide more efficient methods and systems for saving power in a small form-factor pluggable (SFP), SFP+, or 10 Gigabit SFP (XFP) device including an optical transceiver with one or more hardware programmable devices, such as a field programmable gate arrays (FPGA). Although the present technology is described herein using the SFP, SFP+, or XFP device including an optical transceiver, the form factor of the present technology is not limited thereto and may include any other variants or future industry form factors incorporating the present technology. In an aspect, the present disclosure provides a method and/or apparatus for lowering an additional power requirement caused by use of an FPGA independent of physical characterization of the FPGA.

By way of example, the apparatus for saving power in a SFP/SFP+/XFP optical device may include a programmable hardware device, a core voltage switching unit, and control logic. The programmable hardware device may further include a ring oscillator and is configured to operate at a core voltage supplied to the programmable hardware device. In one implementation, the programmable hardware device may be disposed in the SFP/SFP+/XFP optical transceiver. The ring oscillator of the programmable hardware device may have an operating frequency. The core voltage switching unit may be configured to supply the core voltage to the programmable hardware device. The control logic may be disposed in the programmable hardware device and be configured to output a core voltage control signal to the core voltage switching unit, based on the operating frequency of the ring oscillator of the programmable hardware device and a predetermined value. The control logic is further configured to adaptively supply an adjusted core voltage to the programmable hardware device in accordance with certain operating conditions via the core voltage control signal.

In an aspect of the present disclosure, the programmable hardware device may comprise an FPGA or programmable hardware logic or the like.

In an aspect of the present disclosure, the control logic may be further configured to adaptively monitor a difference between the operating frequency of the ring oscillator disposed inside the programmable hardware device and the predetermined value, and output the core voltage control signal to the core voltage switching unit in such a way that a lowest amount of core voltage may be supplied to the programmable hardware device while maintaining a minimum requirement of the programmable hardware device.

In another aspect of the present disclosure, the core voltage control signal may be transmitted from the programmable hardware device to the core voltage switching unit via an inter-integrated circuit (I²C) bus configured to couple the programmable hardware device and the core voltage switching unit. Alternatively, in another implementation, the core voltage control signal may be transmitted from the programmable hardware device to the core voltage switching unit via a serial peripheral interface (SPI) configured to couple the programmable hardware device and the core voltage switching unit.

In another aspect of the present disclosure, the core voltage switching unit may comprise a programmable voltage converter.

Further, in another aspect of the present disclosure, the programmable voltage converter may be configured to drive in an adaptive manner a lowest voltage to the programmable hardware device, meeting a timing requirement of the programmable hardware device, thereby reducing an overall power consumption of the programmable hardware device.

In another aspect of the present disclosure, the control logic may be further configured to automatically adapt the core voltage to a minimum switching requirement of the programmable hardware device.

In another aspect of the present disclosure, the ring oscillator may include a plurality of ring oscillators. The ring oscillator may include four ring oscillators disposed at various locations including at four corners of a die of the programmable hardware device.

These and other features of the present disclosure will become more fully apparent upon consideration of the following detailed description and the accompanying drawings, in which like reference designations represent like features throughout the figures.

BRIEF DESCRIPTION OF THE DRAWINGS

A more detailed understanding may be obtained from the following description in conjunction with the following accompanying drawings.

DETAILED DESCRIPTION

The detailed description of illustrative examples will now be set forth below in connection with the various drawings. The description below is intended to be exemplary and in no way limit the scope of the claimed invention. It provides a detailed example of possible implementation(s), and is not intended to represent the only configuration in which the concepts described herein may be practiced. As such, the detailed description includes specific details for the purpose of providing a thorough understanding of various concepts, and it is noted that these concepts may be practiced without these specific details. In some instances, well known structures and components are shown in block diagram form in order to avoid obscuring such concepts. It is noted that like reference numerals are used in the drawings to denote like elements and features.

While for the purpose of simplicity the methodologies are described herein as a series of steps or acts, it is to be understood that the claimed subject matter is not limited by the order of steps or acts, as some steps or acts may occur in different orders and/or concurrently with other acts from that shown and described herein. Further, not all illustrated steps or acts may be required to implement various methodologies according to the present technology disclosed herein. Also, it should be appreciated that the apparatus and methods described herein may be utilized separately or in combination with other aspects of the present disclosure, or in combination with conventional technology, without departing from the teachings of the present disclosure.

Further, while examples of the present disclosure will be discussed in the context of optical transceivers or optoelectronic devices, those skilled in the art will recognize that the principles of the present disclosure may be implemented in general communications devices and/or optical devices. As used herein, the term "optoelectronic device" includes devices having both optical and electrical components, including small form-factor pluggable (SFP), SFP+, 10 Gigabit small form-factor pluggable (XFP), or the like, and not limited thereto. Further, examples of optoelectronic devices may include transceivers, transmitters, receivers, and/or transponders.

Figure 1:
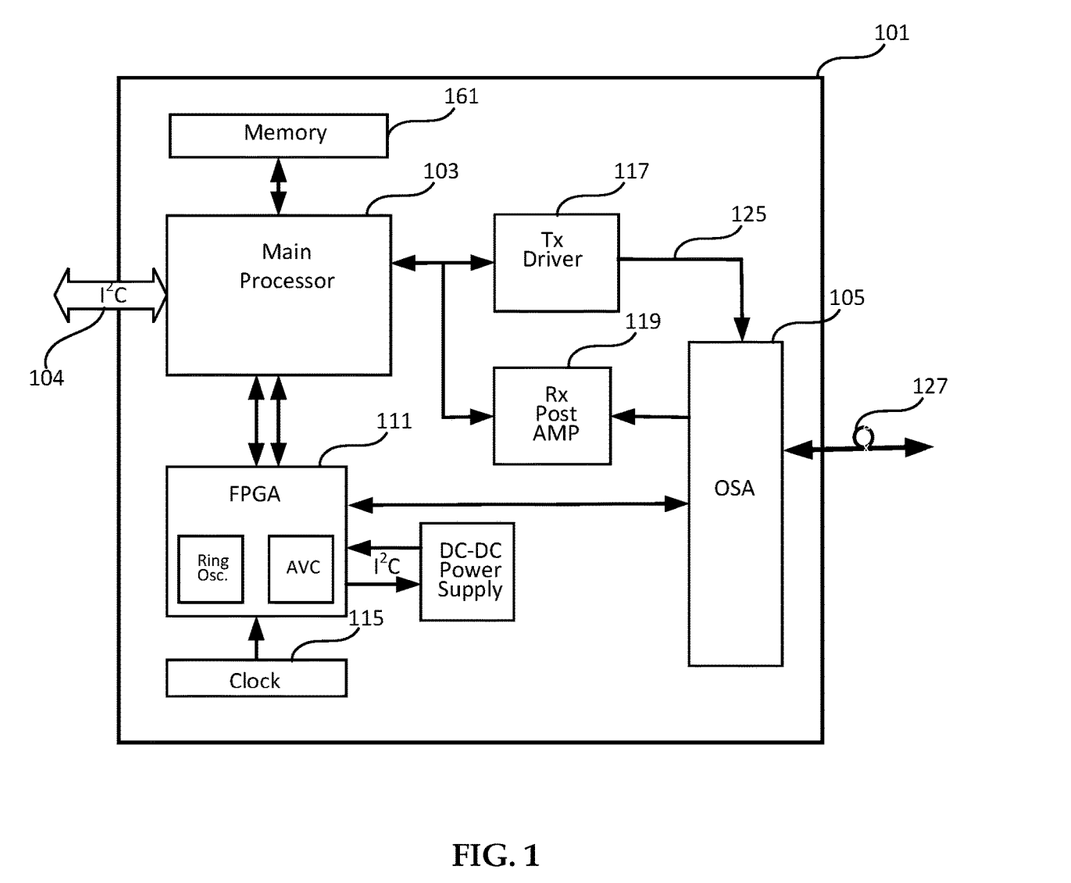
FIG. 1 illustrates an example of an optical transceiver in accordance with an aspect of the present disclosure.

FIG. 1 is a simplified block diagram conceptually illustrating an example of an optical transceiver including various components for use in fiber optic communications, in accordance with an aspect of the present disclosure. The optical transceiver may be used for various bandwidths of optical links, and may be implemented in various optoelectronic devices of any form factor including, but not limited to, SFP, SFP+, XFP or the like, As shown in FIG. 1, an implementation of an optical transceiver 101 in accordance with an aspect of the present disclosure is illustrated. In FIG. 1, the optical transceiver 101 may include, among other components, a main processor 103 (e.g., processor(s), a processing system(s), microcontroller(s), or the like) which is coupled to an inter-integrated circuit ($I^2C$) interface 104, an optical subassembly (OSA) 105, a transmit driver (e.g., Tx Driver) 117, a receive post amplifier (e.g., Rx Post AMP) 119, a hardware programmable device (e.g., FPGA) 111, clock circuitry 115 and a DC-DC power supply coupled to the hardware programmable device 111. Also, the optical transceiver 101 may be coupled to a host device and/or external devices (not shown) via various interfaces including the $I^2C$ interface 104, and an optical link (or fiber optic link) 127. In the example, the hardware programmable device 111 includes a ring oscillator (Ring Osc.) and an adaptive voltage control (AVC) in accordance with an aspect of the present disclosure. In the present disclosure, the word "hardware programmable device" as used herein means a field programmable gate array (FPGA), programmable logic, hardware logic, or the like.

In the example, the main processor 103 of the optical transceiver 101 may be configured to receive various signals, including high speed user data as well as control and/or management signals from an external device (not shown), via the $I^2C$ interface 104 or the optical link 127, and may also be responsible for monitoring and/or controlling various components of the optical transceiver 101, including the optical subassembly (OSA) 105, the transmit driver (e.g., Tx Driver) 117, the receive post amplifier (e.g., Rx Post AMP) 119, the hardware programmable device (e.g., FPGA) 111, etc.

In an aspect of the present disclosure, the main processor 103 may be implemented as a microcontroller unit (MCU), however, the implementation of the main processor 103 may not be limited thereto, and thus may be implemented in one or more processors, microprocessors, microcontrollers, digital signal processors (DSPs), application specific integrated circuits (ASICs), FPGAs, hardware logic, programmable logic, various combinations of hardware and software components, etc. The main processor 103 may also include an internal memory as well as an external memory 161. The internal memory and the external memory 161 may further include random access memory (RAM) or nonvolatile memory or the like.

Further, in the example, the main processor 103 may be configured to send various command signals (e.g., CMD) to and communicate with the FPGA 111 via one or more interrupt line(s) and one or more serial paths, through which various information or data may be transmitted to and/or received from the FPGA 111, for transmission and/or reception processing of a data and/or command signal.

In an aspect of the present disclosure, as mentioned above, the FPGA 111 coupled to a DC-DC power supply may include a plurality of ring oscillators and an adaptive voltage control (AVC). As used herein, typically, an FPGA includes a set of programmable interconnects, logic blocks or configurable logic blocks (CLBs), input/output (I/O) blocks, memory blocks, etc. Also, CLBs are made up of flip-flops and lookup tables and may be configured to do various functions, and the I/O blocks are configured to receive data from a source and output data at the other end.

From a brief signal operation perspective, on a transmission path of a signal, the FPGA 111 may be configured to receive data from the main processor 103. The FPGA 111 is configured to perform various functions relating to the received data, including framing, forward error correction (FEC), encoding functions, etc. For transmission of the data signal via the optical link 127. That is, the optical transceiver 101 may be configured to receive an electrical signal carrying user traffic data at a high speed from the host device, and convert the electrical signal into an optical signal carrying the user traffic data (or payload) for transmission over the optical link 127, via the Tx Driver 117 and the OSA 105, to a remote device (not shown) over the optical link 127.

As such, the Tx Driver 117 of the optical transceiver 101 may include a laser diode (LD) driver for supporting diverse modulations, such as a direct modulation laser (DML), an external modulation laser (EML), or the like. An LD driver output of the electrical signal then drives to a modulation component for generating a main optical signal via the OSA 105, carrying the high-speed user data.

On a reception path of a signal, an optical signal is received by the OSA 105 from the optical link 127, and then the optical signal is converted into an electrical signal via the OSA 105 and the Rx Post Amp 119. The electrical signal output from the Rx Post AMP 119 may be provided to the main processor 103 for further processing of the received electrical signal.

The OSA 105 of the optical transceiver 101 may include a transmitter optical subassembly (TOSA) and a receiver optical subassembly (ROSA), both of which are not shown in FIG. 1. The TOSA may be configured to receive and convert electrical signals into optical signals for transmission over the optical link 127 and the ROSA is configured to receive optical signals from the optical link 127 and convert them into electrical signals for processing by the main processor 103 and/or FPGA 111.

In an aspect of the present disclosure, the main processor (or processing system) 103 may be coupled to the memory 161 and configured to control and manage all the processing functions including optical processing functions. Also, the memory 161 coupled to the main processor 103 may include one or more memory units and may be configured to store various parameters including the parameters relating to the health and operation conditions, etc. of the optical transceiver 101.

The main processor 103 is also configured to control various components of the optical transceiver 101 based on the data either stored in the memory 161 or received from another optical transceiver which may be located at a remote site over the optical fiber link 127.

Further, the I$^2$C interface 104 coupled to the main processor 103 may include a data interface protocol for communications among various devices, e.g., communications between the main processor 103 and the host device for exchanging various types of data, as well as communications between the FPGA 111 and the DC-DC Power Supply. Typically, the I$^2$C interface is a 2-wire serial interface, as defined in the I2C Bus Specification, which consists of a data line (SDA) and a clock line (SCL). In the I$^2$C interface, a master device controls the bus and generates specific conditions that indicate the Start and Stop of data transfer, and a slave device receives and/or transmits data on the bus under control of the master device.

Figure 2A:
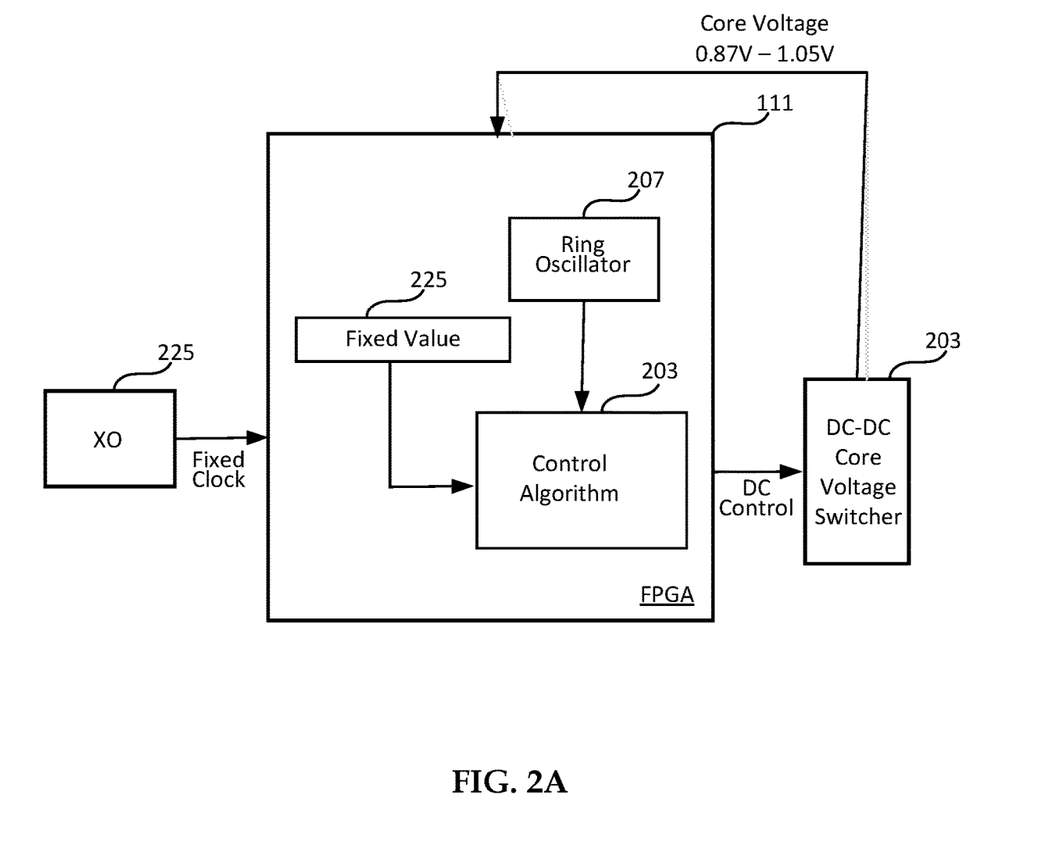
FIG. 2A illustrates an example of a hardware programmable device in accordance with an aspect of the present disclosure.

FIG. 2A is a bock diagram conceptually illustrating an example of an embodiment of the present disclosure in detail. In an aspect of the present disclosure, the FPGA 111 includes a ring oscillator 207, a control algorithm 203, and a fixed value 225 which is stored in a memory or a register. The FPGA 111 is coupled to a DC-DC core voltage switcher 203. The DC-DC core voltage switcher 203 is configured to receive a core voltage control signal (e.g., DC Control) from the FPGA 111 and generate and supply a new core voltage to the FPGA 111 in a specific device core voltage range, i.e., 0.87V-1.05V, specified by the manufacturer of the FPGA 111. Also, an external clock 225 may be coupled to the FPGA 111 and provide a fixed clock signal to the FPGA 111 for reference.

In an aspect of the present disclosure, the example shown in FIG. 2A implements an example of a closed loop adaptive power saving algorithm for the FPGA 111. By way of example, a minimum performance requirement of the FPGA 111 may be expressed in timing requirements which may be determined by a frequency of the ring oscillator 207 disposed inside the FPGA 111. The ring oscillator 207, the control algorithm 203, and the DC-DC Core Voltage Switcher 203 may be used to implement the closed loop adaptive power saving algorithm for the FPGA 111.

Figure 2B:
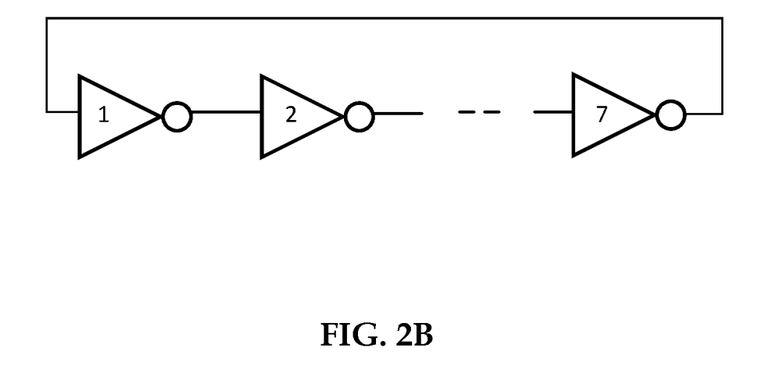
FIG. 2B illustrates an example of a ring oscillator in accordance with an aspect of the present disclosure.

Typically, a ring oscillator comprises a circuit that oscillates because of its logic function and may be implemented by logic elements that realize an inverting function. That is, the ring oscillator may be implemented as a device comprising an odd number of NOT gates whose outputs oscillates between two voltage levels, as shown in FIG. 2B. In an FPGA, such an example of a ring oscillator may be implemented as a chain of look up tables as an oscillating loop. Then, an operating frequency of the ring oscillator may be measured with two counters—one generating a time span based on a known clock rate, and the other counting the slopes in the ring oscillator as an estimate of the operating frequency of the ring oscillator. When there is a change in temperature or variations of supply voltages to the FPGA, there will be a frequency drift of the ring oscillator, and in turn the frequency drift of the ring oscillator may affect the timing speed (or switching speed) of the FPGA. As such, using the adaptive control scheme described herein, the timing speed of the FPGA may be modified by providing a new, adjusted different core voltage to the FPGA.

Further, it is noted that in an aspect of the present disclosure, a high core voltage supplied to the FPGA 111 may increase the switching speed of the FPGA 111, whereas a low core voltage supplied to the FPGA 111 may decrease the switching speed of the FPGA 111. As such, and mentioned above, the adjustment to the core voltage to the FPGA 111 may be made by means of the control algorithm 203 and the DC-DC core voltage switcher 203. Thus, a lowest voltage (or core voltage) may be supplied to the core of the FPGA 211 by a programmable voltage converter, e.g., the DC-DC core voltage switcher 203. Also, a temperature may be controlled for optimal performance of the FPGA 111 as well as the optical transceiver incorporating the present technology therein. That is because as the temperature is lowered, the switching speed may be slowed and the control loop for adjusting the core voltage to the FPGA 111 may automatically operate to adapt the core voltage that is to be supplied to the FPGA 111 to a minimum switching requirement.

In the example shown in FIG. 2A, the control algorithm (or control unit or adaptive voltage control (AVC)) 203 is configured to compare the operating frequency value of the ring oscillator 207 with a predetermined value, e.g., a fixed value 225 (or a threshold), and determine a difference between the operating frequency value of the ring oscillator 207 and the fixed value 225. Based on the difference, the control unit 203 may determine a corrected core voltage and send a core voltage signal, e.g., a DC control, to the DC-DC core voltage switcher 203, which then supplies a new, adjusted core voltage to the FPGA 111. This is a simple description of an adaptive closed loop control scheme in accordance with various aspects of the present technology, for generating and supplying an optimum core voltage to the FPGA 111, meeting the minimum switching requirement of the FPGA 111.

That is, by performing a repetitive process or the adaptive closed loop control, in response to changes in the performance of the FPGA 211, which is measured using the ring oscillator 207 inside the FPGA 211, an updated core voltage that is to be supplied to the FPGA 111 is determined and supplied to the FPGA 111 by the DC-DC core switcher 203, thereby driving the core voltage to the FPGA 111 to an absolute minimum while maintaining the switching performance of the FPGA 111. Further, the low core voltage supplied to the FPGA 111 in such a manner may in turn cause transistors in the FPGA 111 to leak a magnitude less at high temperatures, thereby resulting in a significant amount of reduction in static power of the FPGA 111.

Figure 3:
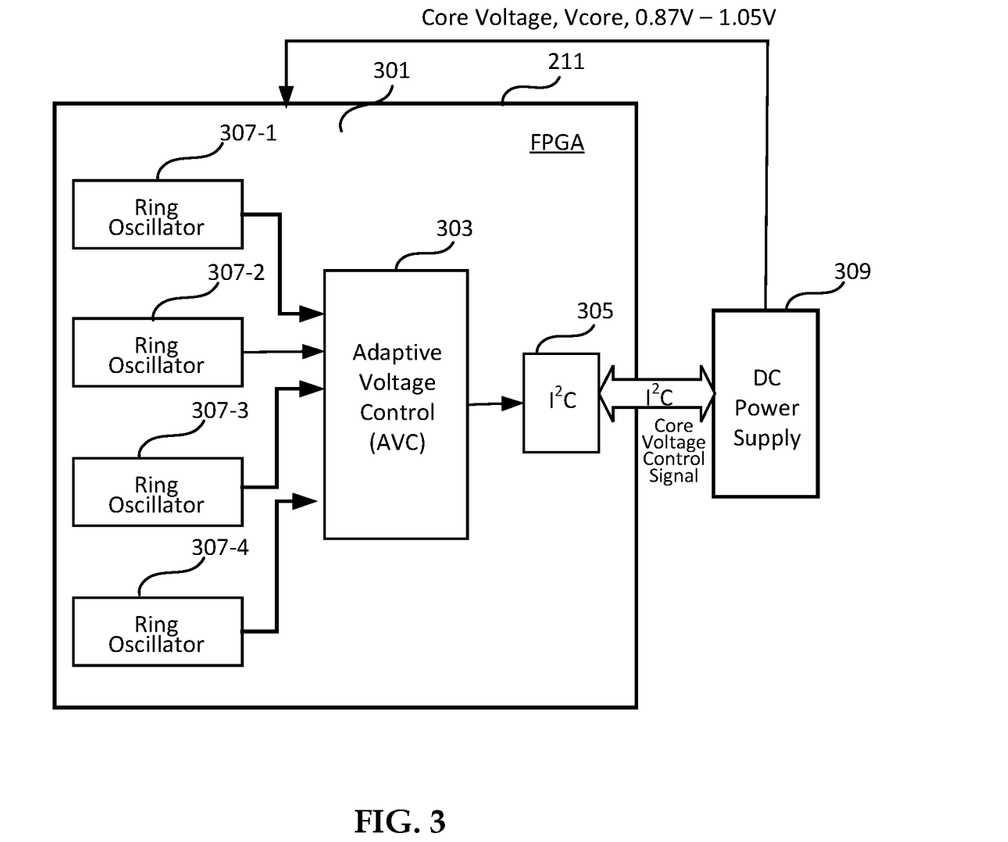
FIG. 3 is a block diagram conceptually illustrating another example of an embodiment of the present technology in accordance with an aspect of the present disclosure.

FIG. 3 is a block diagram conceptually illustrating another example of the present technology. The example shown in FIG. 3 includes an FPGA 211 and a DC Power Supply 309 coupled to the FPGA 211. The FPGA 211 may include a plurality of ring oscillators 307-1, 307-2, 307-3, and 307-4, an adaptive voltage control (AVC) 303, and a I$^2$C interface 305.

In an aspect of the present disclosure, the plurality of ring oscillators 307-1, 307-2, 307-3, and 307-4 may be disposed on a die 301 of the FPGA 211. In the example, the plurality of oscillators 307-1, 307-2, 307-3, and 307-4 may be disposed in a variety of fashions. In one implementation, as shown in FIG. 3, the plurality of ring oscillators 307-1, 307-2, 307-3, and 307-4 may be instantiated on the die 301 of the FPGA 211 at a vertical line in one side, but the arrangement of the plurality of ring oscillators that are instantiated on the die 301 of the FPGA 211 may not be limited thereto. In another implementation, the plurality of ring oscillators 307-1, 307-2, 307-3, and 307-4 may be instantiated and disposed in corners of the die 301 of the FPGA 211 in such a manner that better characterization of the performance of the FPGA 211 may be obtained by measuring the operating frequencies of the ring oscillators disposed at corners of the FPGA 211.

Typically, each of the plurality of ring oscillators may be constructed with transistors used in a controllable power domain to determine a leakage current of the transistors for the associated controllable power domain. A ring oscillator may thus comprise high threshold voltage transistors and may output an oscillating waveform that may be counted in a frequency counter during a fixed measurement period to determine a frequency or an operating frequency of the ring oscillator.

In the example, the plurality of ring oscillators 307-1, 307-2, 307-3, and 307-4 are coupled to the adaptive voltage control unit 303, which is in turn coupled to the DC Power Supply 309 via the I$^2$C interface 305. The adaptive voltage control unit 303 produces, based on an adaptive voltage control algorithm, an offset or an adjustment amount for the core voltage, Vcore, that is supplied to the FPGA 211 by the DC Power Supply 309. The DC Power Supply 309 receives the offset or the adjustment amount for the core voltage, Vcore, from the FPGA 211, via a core voltage control signal from the adaptive voltage control unit 303. The DC Power Supply 309 generates and supplies the adjusted core voltage, Vcore, to the FPGA 211.

In one implementation, the DC Power Supply 309 may be implemented by a programmable voltage regulator, e.g., TPS62362 voltage regulator. TPS62362 is a high frequency synchronous step down dc-dc converter and produces an output voltage in a range of 0.77V to 1.4V, programmable via the I$^2$C interface in 10 mV steps. Further, in the example, the core voltage may only be written by the adaptive voltage control (AVC) 303 via the I$^2$C interface 305 when an update is needed. Also, although the core voltage control in the example is done via the I$^2$C interface, but it may not be limited thereto. For example, in another implementation, a serial peripheral interface (SPI) may be used instead of the I$^2$C interface and an SPI controlled voltage regulator may be used instead of the I$^2$C controlled voltage regulator (e.g., TPS62362).

Typically, an FPGA may need many different voltages for its operation. For example, the FPGA may need to operate at a core voltage at which its internal logic array operates, and at I/O voltages at which its I/O pins or buffers are driven. The I/O pins of the FPGA can support a range of voltages and I/O reference voltages may be generated from different I/O voltages. In one implementation, in a case of a Xilinx 7 series FPGA, the core voltage may be in a range of 0.87 V and 1.05 V, and the I$^2$C operating frequency may be limited to 100 KHz.

In an aspect of the present disclosure, using the adaptive voltage control scheme disclosed herein, the AVC 303 may minimize or decrease a core voltage, thereby reducing power that is needed for internal logic operation of the FPGA 211. Also, the AVC 303 may increase the core voltage to the FPGA 211 when the performance of the FPGA 211 is not sufficient and need to increase its switching or operational speed of the FPGA 211.

As noted above, the performance of the FPGA 211 may be estimated by measuring different frequencies of the plurality of ring oscillators 307-1, 307-2, 307-3, and 307-4 disposed in the FPGA 211. In one implementation, a frequency of a slowest ring oscillator may be used to estimate the performance of the FPGA 211. That is, in the example, the AVC 303 may be configured to use a lowest frequency of the plurality of ring oscillator 307-1, 307-2, 307-3, and 307-4, as an estimate of the performance of the FPGA 211. The estimate of the performance of the FPGA 211 may then be used by the AVC 303 in a closed loop control for determining a needed offset amount for the core voltage that is to be supplied to the FPGA 211 to bring the performance of the FPGA 211 within a desired target range.

Further, the AVC 303 may be configured to operate in three different modes, Mode A, Mode B, and Mode C. In Mode A, an adaptive core voltage control is disabled and the core voltage is fixed to a certain value, i.e., 1.0V, for the operation of the FPGA 211, after a reset. In Mode B, the core voltage to the FPGA 211 may be set manually to a predetermined voltage in a range of, i.e., 0.87 V and 1.05 V, in a certain voltage step. In Mode C, a closed-loop adaptive core voltage control is turned on and performed automatically. That is, in Mode C, the core voltage control may be performed automatically based on characterization of actual performance of the FPGA 211 as described in the present disclosure. Further, the mode of the AVC 303 may be set and controlled by an external device such as the main processor 103 as shown in FIG. 1.

Figure 4:
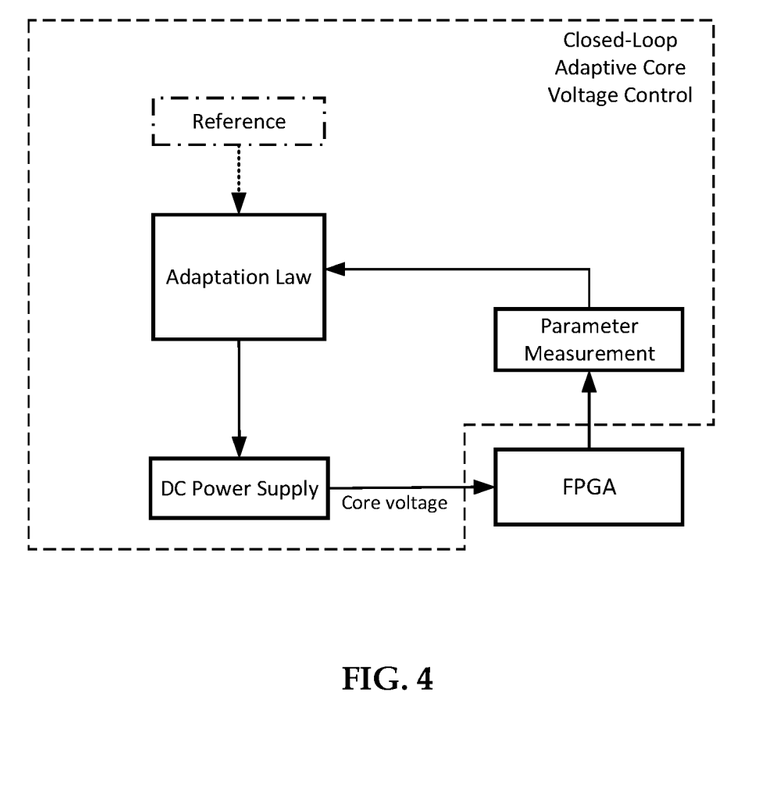
FIG. 4 is a block diagram conceptually illustrating an example of a control method for an adaptive voltage control in accordance with an aspect of the present disclosure.

FIG. 4 is a block diagram conceptually illustrating an example of a closed-loop adaptive core voltage control scheme. In the example, the performance of a programmable hardware device (e.g., FPGA) is estimated by measuring specific parameter(s), e.g., operating frequencies of one or more ring oscillators that are instantiated inside the programmable hardware device. By way of example, the measured operating frequencies of the one or more ring oscillators are used as the measurement of the estimated performance of the FPGA and input to the adaptation law. Based on the estimated performance of the FPGA, the adaptation law outputs an offset or an adjustment amount to the core voltage to the FPGA and input the information to the DC Power Supply, which in turn generates and supplies an adjusted core voltage to the FPGA. As such, the closed-loop adaptive core voltage control may provide a significant amount of power saving in the FPGA (or the hardware programmable device), using one or more parameter measurement devices such as ring oscillators instantiated inside the FPGA (or the programmable hardware device), and drives the core voltage to an optimum value, meeting the minimum switching requirements of the FPGA (or the programmable hardware device), providing huge savings both in dynamic power as well as static power of the FPGA (or the programmable hardware device). A more detailed example of control logic for the adaptation law for the core voltage to the FPGA is illustrated in FIG. 5.

Figure 5:
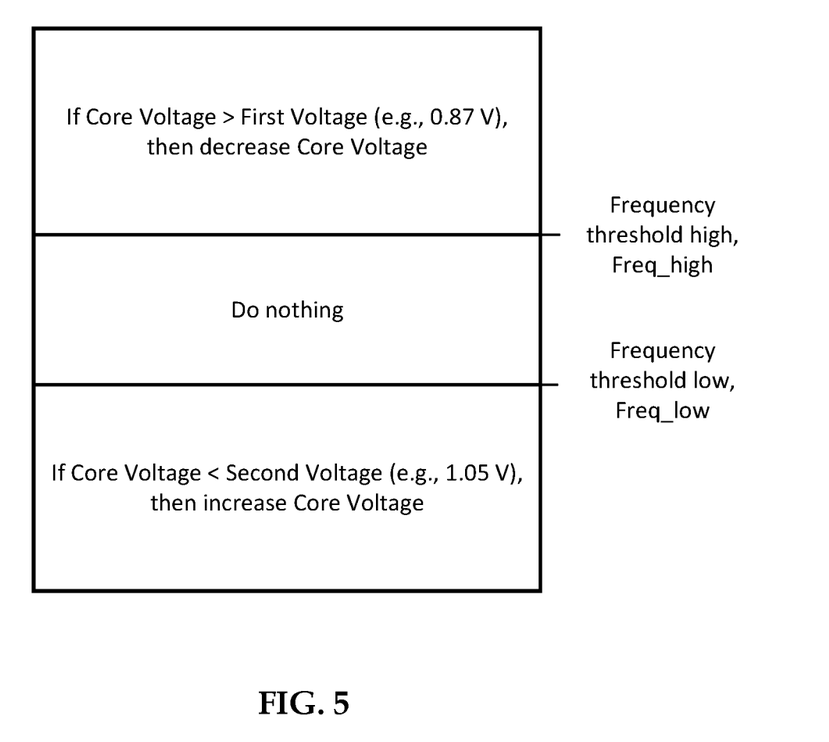
FIG. 5 illustrates an example of a control method for an adaptive voltage control in accordance with an aspect of the present disclosure.

In the example shown in FIG. 5, when the AVC 303 is set to Mode C, the voltage control for supplying a core voltage to the FPGA 211 is performed automatically in a closed-loop adaptive core voltage control as described herein. By way of example, for the closed-loop adaptive core voltage control, a frequency threshold low, Freq_low, and a frequency threshold high, Freq_high, for one or more of the ring oscillators may be initially set. When a slowest ring oscillator among the plurality of ring oscillators 307-1, 307-2, 307-3, and 307-4 is determined to have an operating frequency which is higher than the frequency threshold high, Freq_high, and when the core voltage to the FGPA 211 is greater than a first voltage, e.g., 0.87 V, then the core voltage that is to be supplied to the FPGA 211 may be decreased by a predetermined amount, i.e., 10 mV, in a repetitive fashion until the operating frequency of the slowest ring oscillator in the FPGA 211 becomes less than the frequency threshold high, Freq_high.

On the other hand, when the operating frequency of the slowest ring oscillator among the plurality of ring oscillators 307-1, 307-2, 307-3, and 307-4 is determined to have a frequency which is greater than the frequency threshold low, Freq_low, and the core voltage to the FPGA 211 is less than a second voltage, e.g., 1.05 V, the core voltage that is to be supplied to the FPGA 211 may be increased by a predetermined amount, i.e., 10 mV in a repetitive fashion until the operating frequency of the slowest ring oscillator in the FPGA 211 becomes greater than the frequency threshold low, Freq_low.

Further, when the operating frequency of the slowest ring oscillator among the plurality of ring oscillators 307-1, 307-2, 307-3, and 307-4 is determined to have a frequency between the frequency threshold high, Freq_high, and the frequency threshold low, Freq_low, then no adjustment to the core voltage to the FPGA 211 is made.

As noted above, by means of the AVC 303 and the plurality of ring oscillators, the core voltage that is to be supplied to the FPGA 211 may be adjusted or modified based on the measured frequencies of the plurality of ring oscillators, which may vary in response to changes in the performance of the FPGA 211. Over time, by using the present technology disclosed herein, the core voltage to the FPGA 211 may be adaptively driven to a minimum while maintaining the switching performance of the FPGA 211, which results in great savings in power consumed by the FPGA 211. Further, the low core voltage to the FPGA 211 may in turn cause the transistors in the FPGA 211 to leak a magnitude less than at high temperatures, and as such results in a reduction of static power of the FPGA 211. Hence, in accordance with various aspects of the present disclosure, the dynamic power as well as the static power of the FPGA 211 may be reduced greatly to an absolute minimum, thereby improving the performance of the FPGA 211 and the system including the FPGA 211.

Various aspects of the present disclosure may also be implemented by one or more processing systems. For example, the optical transceiver 101, or its various components as shown in FIG. 1 may be implemented with a bus architecture, which may include a bus and any suitable number of interconnecting buses and bridges, as shown in FIG. 6.

Figure 6:
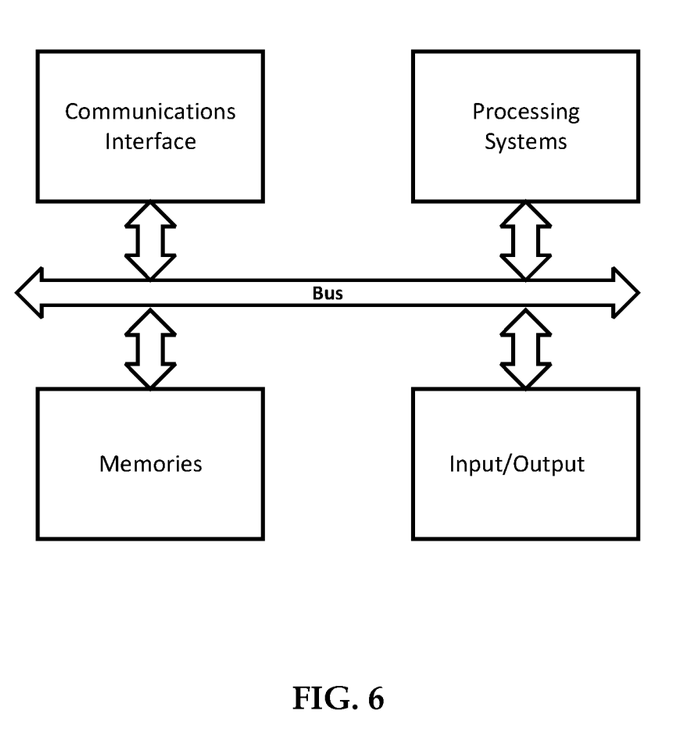
FIG. 6 illustrates an example implementation in accordance with an aspect of the present disclosure.

FIG. 6 shows a diagram conceptually illustrating an example of a processing system, which may be implemented in the main processor 103 or hardware programmable device (e.g., the FPGA 111) as shown in FIG. 1. As shown in FIG. 6, the bus may link together various circuits, including one or more processing systems (or processors), one or more memories, one or more communication interfaces, and/or one or more input/output devices. The one or more processing systems may be responsible for managing the bus and general processing, including the execution of software stored on a non-transitory computer-readable medium. Further, the one or more processing systems may include one or more processors, such as microprocessors that interpret and execute instructions. In other implementations, the one or more processing systems may be implemented as or include one or more application specific integrated circuits, field programmable logic arrays, or the like. The software, which is often embodied in a non-transitory computer-readable medium, when executed by the one or more processing systems, may cause the one or more processing systems to perform the various functions described herein for any particular apparatus. The non-transitory computer-readable medium may also be used for storing data that is manipulated by the one or more processing systems when executing software. The one or more memories may include various types of memories, including a random access memory and/or a read only memory, and/or other types of magnetic or optical recording medium and its corresponding device for storing information and/or instructions and/or retrieval thereof. The one or more communication interfaces may also include any transceiver-like mechanism that enables communication with other devices and/or systems, including optical transceivers (e.g., TOSA and/or ROSA). The one or more input/output devices may include devices that permit inputting information and/or outputting information to an external device or an operator.

The term "small form-factor (SFP)" or "SFP module" as used herein refers to a specification for optical modular transceivers, which are designed for use with small form factor connectors and may be hot-swappable devices. The SFP modules may be multi-source agreement (MSA) compliant and allow for optical and/or electrical interfaces, converting the electrical signals to optical signals, vice versa, and may be available for use with a variety of media, such as copper media, optical fiber (e.g., multimode optical fiber, or single mode optical fiber), etc. Generally, an existing SFP module may be used to plug into a port of a network switch and connect to a fiber channel and gigabit Ethernet (GbE) optical fiber cables at the another location thereon. Thus, the existing SFP module may enable the same electrical port on the network switch to connect to different types of optical fibers, including multi-mode or single-mode fibers.

Even though particular combinations of features are disclosed in the specification and/or recited in the claims, these combinations are not intended to limit the disclosure of the present technology. Further, the methods or methodologies for the present technology disclosed herein may be implemented in software, hardware, any combinations of software and hardware, a computer program or firmware incorporated in a computer readable medium for execution by a controller, a processor, a computer, or a processing system that includes one or more processors.

Here, the term "processing system" or "processor component" as used herein means any hardware, software, or any combination thereof, which can perform or execute various functions or algorithms described herein in the present disclosure. The processing system (or processor component or processor) may include, but not limited thereto, one or more processing systems including processors, central processing unit (CPU), microcontrollers, microprocessors, controllers, integrated circuits, application specific integrated circuits (ASIC), hardware logics, digital signal processors (DSPs), discrete hardware circuits, gates, state machines, programmable logic devices (PLDs), field programmable gate arrays (FPGA), programmable logic circuits or devices, or the like configured to perform various functions described herein.

The term "software" as used herein is to be construed broadly to mean any instructions, instruction sets, programs, subprograms, code, program code, software modules, applications, software packages, routines, objects, executables, threads of execution, procedures, functions, etc. including firmware, microcode, middleware, software, hardware description language, or the like. configured to perform various functions in accordance with aspects of the present disclosure. Also, the software may be stored on a computer-readable medium. Examples of a computer-readable medium may include a non-transitory computer-readable medium, such as, by way of example, an optical disk, a magnetic storage device, a digital versatile disk, a flash memory, random access memory (RAM), read only memory (ROM), a register, programmable ROM (PROM), erasable PROM (EPROM), electrically erasable PROM (EEPROM), a removable disk, a flash memory device, and any other suitable medium for storing software that may be accessed and read by a processor or a processing system. It is also appreciated that one skilled in the art will recognize how best to implement the described functionality relating to adding new system functionalities to an existing network element, depending upon a particular application within design constraints.

The term "unit" or "component" as used herein means software, hardware, or any combinations thereof. A unit may be implemented as a software component, a hardware component, or any combinations thereof, including a FPGA, logic, logic arrays, ASIC, DSP, microcontroller, microprocessor, etc. or any combination thereof. The unit thus may include software components, task components, processes, procedures, functions, program code, firmware, microcodes, circuits, data structures, tables, arrays, and variables.

While for the purpose of simplicity the methodologies are described herein as a series of steps or acts, it is to be understood that the claimed subject matter is not limited by the order of steps or acts, as some steps or acts may occur in different orders and/or concurrently with other acts from that shown and described herein. Further, not all illustrated steps or acts may be required to implement various methodologies according to the present technology disclosed herein. Furthermore, the methodologies disclosed herein and throughout this specification are capable of being stored on an article of manufacture to facilitate transporting and transferring such methodologies to one or more processing systems.

The term "article of manufacture" is intended to encompass a computer program accessible from any computer-readable device, carrier, or medium. A singular form may include a plural form if there is no clearly opposite meaning in the context. Also, as used herein, the article "a" is intended to include one or more items. Further, no element, act, step, or instruction used in the present disclosure should be construed as critical or essential to the present disclosure unless explicitly described as such in the present disclosure.

As used herein, except explicitly noted otherwise, the term "comprise" and variations of the term, such as "comprising," "comprises," and "comprised" are not intended to exclude other additives, components, integers or steps. The terms "first," "second," and so forth used herein may be used to describe various components, but the components are not limited by the above terms. The above terms are used only to discriminate one component from other components, without departing from the scope of the present disclosure.

Also, the term "and/or" as used herein includes a combination of a plurality of associated items or any item of the plurality of associated items. Further, it is noted that when it is described that an element is "coupled" or "connected" to another element, the element may be directly coupled or directly connected to the other element, or the element may be coupled or connected to the other element through a third element.

In the present disclosure, the term "include" or "have" as used herein indicates that a feature, an operation, a component, a step, a number, a part or any combination thereof described herein is present. Further, the term "include" or "have" does not exclude a possibility of presence or addition of one or more other features, operations, components, steps, numbers, parts or combinations.

Although the present technology has been illustrated with specific examples described herein for purposes of describing example embodiments, it is appreciated by one skilled in the relevant art that a wide variety of alternate and/or equivalent implementations may be substituted for the specific examples shown and described without departing from the scope of the present disclosure. As such, the present disclosure is intended to cover any adaptations or variations of the examples and/or embodiments shown and described herein, without departing from the spirit and the technical scope of the present disclosure.

What is claimed is:

1. An apparatus for saving power, the apparatus comprising an optical transceiver,
wherein the optical transceiver comprises:
a main processor disposed in the optical transceiver and configured to control a transmit driver and a receive post amplifier;
a programmable hardware device disposed in the optical transceiver and outside the main processor, the programmable hardware device including a plurality of ring oscillators having an operating frequency, and being configured to operate at a core voltage;
a programmable voltage converter disposed in the optical transceiver and configured to supply the core voltage to the programmable hardware device; and
control logic disposed in the programmable hardware device and configured to output a core voltage control signal to the programmable voltage converter, based on the operating frequency of the ring oscillator,
wherein the programmable voltage converter is further configured to adaptively supply the core voltage to the programmable hardware device in accordance with the core voltage control signal, and
wherein a lowest operating frequency among a plurality of operating frequencies of the plurality of ring oscillators is selected as the operating frequency of the plurality of ring oscillators.

2. The apparatus of claim 1, wherein the programmable hardware device comprises a field programmable gate array (FPGA).

3. The apparatus of claim 1, wherein the optical transceiver comprises a small form factor pluggable (SFP), SFP+, or 10 Gigabit SFP (XFP) optical transceiver.

4. The apparatus of claim 1, wherein the control logic is further configured to adaptively monitor a difference between the operating frequency and a predetermined value, and output the core voltage control signal to the programmable voltage converter such that a lowest core voltage is supplied to the programmable hardware device while maintaining a minimum timing requirement of the programmable hardware device.

5. The apparatus of claim 1, wherein the core voltage control signal is transmitted from the programmable hardware device to the programmable voltage converter via an inter-integrated circuit ($I^2C$) bus configured to couple the programmable hardware device and the programmable voltage converter.

6. The apparatus of claim 1, wherein the core voltage control signal is transmitted from the programmable hardware device to the programmable voltage converter via a serial peripheral interface (SPI) configured to couple the programmable hardware device and the programmable voltage converter.

7. The apparatus of claim 1, wherein the programmable voltage converter is configured to drive a lowest core voltage to the programmable hardware device, to meet a minimum timing requirement of the programmable hardware device and reduce an overall power consumption of the programmable hardware device.

8. The apparatus of claim 1, wherein the control logic is further configured to adaptively determine an offset to change the core voltage to the hardware programmable device such that a minimum switching requirement of the programmable hardware device is met.

9. The apparatus of claim 1, wherein the plurality of ring oscillators comprises four ring oscillators disposed at corners of a die of the programmable hardware device.

* * * * *